United States Patent
Redeker et al.

(10) Patent No.: US 7,368,017 B2
(45) Date of Patent: May 6, 2008

(54) METHOD AND APPARATUS FOR SEMICONDUCTOR WAFER PLANARIZATION

(75) Inventors: Fred C. Redeker, Fremont, CA (US); John Boyd, Atascadero, CA (US); Yezdi Dordi, Palo Alto, CA (US); William Thie, Mountain View, CA (US); Bob Maraschin, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 531 days.

(21) Appl. No.: 10/734,704

(22) Filed: Dec. 12, 2003

(65) Prior Publication Data

US 2005/0126932 A1 Jun. 16, 2005

(51) Int. Cl.
B05C 3/02 (2006.01)
(52) U.S. Cl. .................... 118/429; 118/620; 451/36; 451/41
(58) Field of Classification Search ............. 118/50.01, 118/620, 429; 216/87, 94; 451/36, 41; 156/345.12; 438/692
See application file for complete search history.

(56) References Cited

U.S. PATENT DOCUMENTS

| | | | | |
|---|---|---|---|---|
| 4,982,065 A * | 1/1991 | Sandaiji et al. ............... 216/22 |
| 5,096,550 A * | 3/1992 | Mayer et al. ............... 205/642 |
| 6,496,001 B1 * | 12/2002 | Barringer et al. ........ 324/158.1 |
| 6,699,400 B1 * | 3/2004 | Ballantine et al. ............ 216/90 |
| 6,900,889 B2 * | 5/2005 | Bjornson et al. ........... 356/246 |
| 2004/0192173 A1 * | 9/2004 | Zuniga et al. ................ 451/41 |
| 2005/0003737 A1 * | 1/2005 | Montierth et al. ............. 451/5 |

* cited by examiner

Primary Examiner—Laura Edwards
(74) Attorney, Agent, or Firm—Martine Penilla & Gencarella, LLP

(57) ABSTRACT

Broadly speaking, the present invention provides a method and an apparatus for planarizing a semiconductor wafer ("wafer"). More specifically, the present invention provides for depositing a planarizing layer over the wafer, wherein the planarizing layer serves to fill recessed areas present on a surface of the wafer. A planar member is positioned over and proximate to a top surface of the wafer. Positioning of the planar member serves to entrap electroless plating solution between the planar member and the wafer surface. Radiant energy is applied to the wafer surface to cause a temperature increase at an interface between the wafer surface and the electroless plating solution. The temperature increase in turn causes plating reactions to occur at the wafer surface. Material deposited through the plating reactions forms a planarizing layer that conforms to a planarity of the planar member.

16 Claims, 4 Drawing Sheets

METHOD AND APPARATUS FOR SEMICONDUCTOR WAFER PLANARIZATION

CROSS REFERENCE TO RELATED APPLICATIONS

This application is related to U.S. patent application Ser. No. 10/735,216, filed Dec. 12, 2003 and entitled "Method and Apparatus for Material Deposition." The disclosure of this related application is incorporated herein by reference.

BACKGROUND OF THE INVENTION

1. Field of the Invention

The present invention relates generally to semiconductor fabrication. More specifically, the present invention relates to material deposition and associated planarization on a semiconductor wafer.

2. Description of the Related Art

In the fabrication of semiconductor devices such as integrated circuits, memory cells, and the like, a series of manufacturing operations are performed to define features on semiconductor wafers. The semiconductor wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

The series of manufacturing operations for defining features on the semiconductor wafers can include many processes such as adding, patterning, etching, removing, polishing, and planarizing among others, various material layers. Due to the intricate nature of the features defined on the semiconductor wafers, it is necessary to perform each process in a precise manner. For example, it is often desirable to planarize a surface of the wafer in a precise manner to decrease variations in a surface topography of the wafer. Without precise planarization, fabrication of additional metallization layers becomes substantially more difficult due to increased variations in the surface topography of the wafer.

A chemical mechanical planarization (CMP) process is one method for performing wafer planarization. In general, the CMP process involves holding and contacting a rotating wafer against a moving polishing pad under a controlled pressure. CMP systems typically configure the polishing pad on a rotary table or a linear belt. Additionally, a slurry is disposed to be present an interface between the wafer and the polishing pad to facilitate and enhance the CMP process.

While the CMP process is quite capable and useful for providing wafer planarization, there is an ever present desire to continue researching and developing alternative techniques for performing wafer planarization. In view of the foregoing, there is a need for an apparatus and a method to planarize a wafer that can be implemented either as an alternative or as a complement to the traditional CMP process.

SUMMARY OF THE INVENTION

Broadly speaking, a method and an apparatus are provided for planarizing a semiconductor wafer ("wafer"). More specifically, the present invention provides a method and apparatus for depositing a planarizing layer over the wafer, wherein the planarizing layer serves to fill recessed areas present on a surface of the wafer. In accordance with the present invention, a planar member is positioned over and proximate to a top surface of the wafer. The positioning of the planar member serves to entrap electroless plating solution between the planar member and the wafer surface such that the recessed areas present on the wafer surface are filled with electroless plating solution. Radiant energy is then applied to the wafer surface to selectively heat a material present on the wafer surface. The selective heating of the wafer surface causes a temperature increase at an interface between the wafer surface and the electroless plating solution. The temperature increase in turn causes plating reactions to occur at the wafer surface. Reactants present within the electroless plating solution between the planar member and the wafer surface are consumed through continued application of the radiant energy. The planar member is then moved away from the wafer to allow fresh electroless plating solution to be interspersed between the planar member and the wafer. Then, the planar member is repositioned and the radiant energy is reapplied. Eventually, the material deposited through the plating reactions forms a planarization layer that conforms to a planarity of the planar member.

In one embodiment, an apparatus for depositing a planarizing layer over a wafer is disclosed. The apparatus includes a tank defined by a bottom and an enclosing wall. The tank is configured to contain an electroless plating solution. The apparatus also includes a wafer support structure disposed within the tank. The wafer support structure is configured to support the wafer at a submerged position within the electroless plating solution to be contained within the tank. The apparatus further includes a planar member disposed above and substantially parallel to the wafer support structure. The planar member is movable in directions both toward and away from the wafer support structure. The planar member is also capable of being positioned proximate to the wafer when supported by the wafer support structure. Additionally, the apparatus includes a radiant energy source disposed above the planar member and above the wafer support structure. The radiant energy source is oriented to direct radiant energy through the planar member and to the wafer when supported by the wafer support structure.

In another embodiment, a method for applying a planarizing layer on a surface of a wafer is disclosed. The method includes an operation for applying an electroless plating solution to the wafer surface. The electroless plating solution is maintained at a temperature at which a plating reaction does not readily occur. The method also includes positioning a planar member over and proximate to a top portion of the wafer surface. The planar member serves to expel a portion of electroless plating solution interposed between the planar member and the wafer surface. The method further includes exposing the wafer surface to radiant energy by passing the radiant energy through the planar member. The radiant energy is capable of increasing a temperature of the wafer surface to a state at which the plating reaction occurs at an interface between the electroless plating solution and the wafer surface. The plating reaction forms a planarizing layer between the wafer surface and the planar member.

In another embodiment, another method for applying a planarizing layer on a surface of a wafer is disclosed. In the method, an electroless plating solution is applied to the wafer surface. The electroless plating solution is maintained at a temperature at which a plating reaction does not readily occur. A planar member is then moved over and proximate to a top portion of the wafer surface. The planar member serves to expel a portion of electroless plating solution interposed between the planar member and the wafer surface. Radiant energy is then applied through the planar member to the wafer surface. The radiant energy is capable of increasing a temperature of the wafer surface to a state at which the plating reaction will occur at an interface between the electroless plating solution and the wafer surface. A wavelength range of the radiant energy is controlled such that the radiant energy selectively heats a material present at the wafer surface. Reactants present in a remaining amount of electroless plating solution interposed between the planar member and the wafer surface are allowed to be consumed in plating reactions. Application of the radiant energy to the wafer surface is then discontinued. The planar member is moved away from the top portion of the wafer surface to allow fresh electroless plating solution to be introduced between the planar member and the wafer surface. Planarization of the wafer surface is approached by repetitively performing the aforementioned sequence of operations.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION

Broadly speaking, a method and an apparatus are provided for planarizing a semiconductor wafer ("wafer"). More specifically, the present invention provides a method and an apparatus for depositing a planarizing layer over the wafer, wherein the planarizing layer serves to fill recessed areas present on a surface of the wafer. In accordance with the present invention, a planar member is positioned over and proximate to a top surface of the wafer. The positioning of the planar member serves to entrap electroless plating solution between the planar member and the wafer surface such that the recessed areas present on the wafer surface are filled with electroless plating solution. Radiant energy is then applied to the wafer surface to selectively heat a material present on the wafer surface. The selective heating of the wafer surface causes a temperature increase at an interface between the wafer surface and the electroless plating solution. The temperature increase in turn causes plating reactions to occur at the wafer surface. Reactants present within the electroless plating solution between the planar member and the wafer surface are consumed through continued application of the radiant energy. The planar member is then moved away from the wafer to allow fresh electroless plating solution to be interspersed between the planar member and the wafer. Then, the planar member is repositioned and the radiant energy is reapplied. Eventually, the material deposited through the plating reactions forms a planarizing layer that conforms to a planarity of the planar member.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
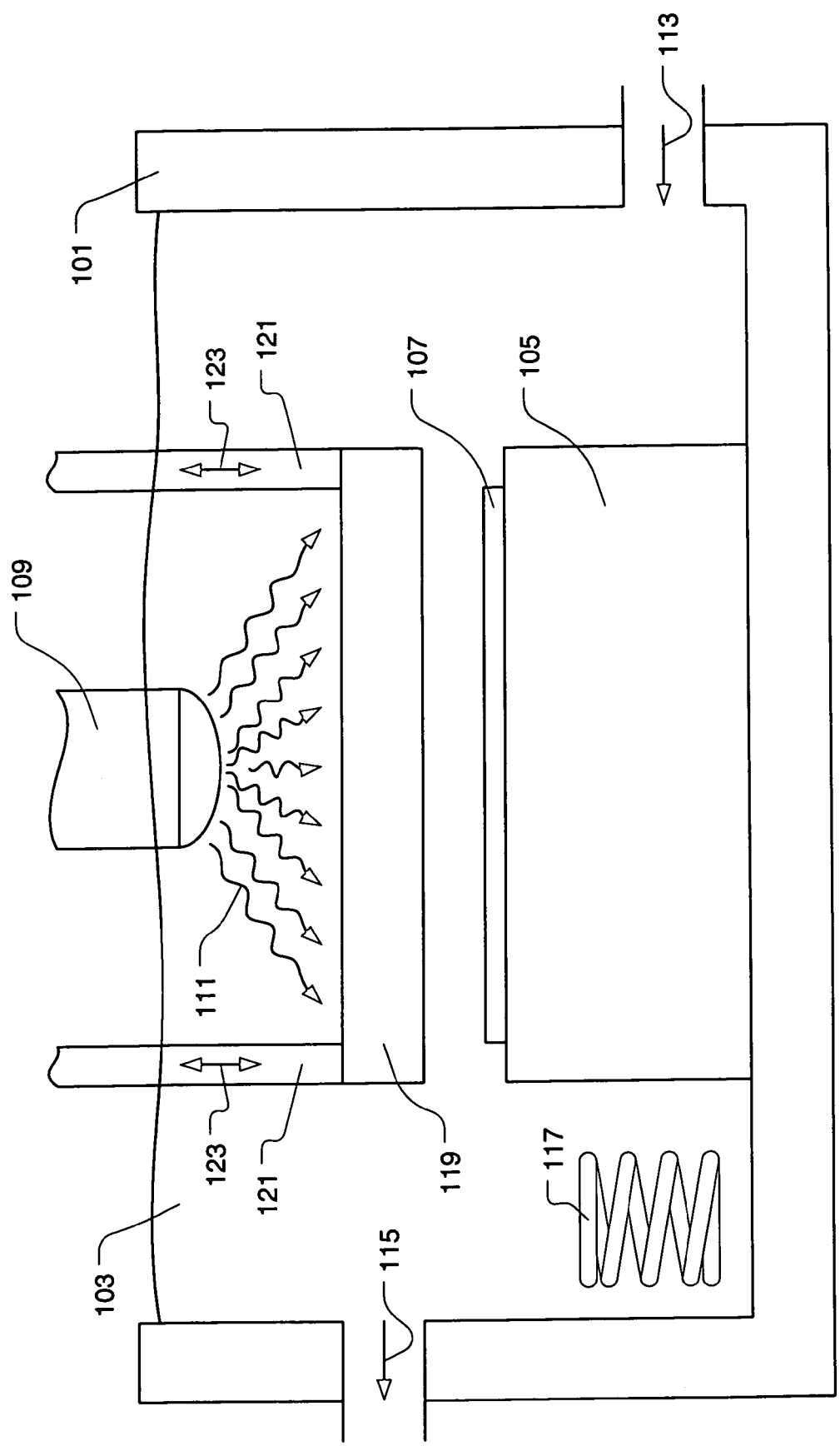
FIG. 1 is an illustration showing an apparatus for depositing a planarizing layer over a wafer, in accordance with one embodiment of the present invention.

FIG. 1 is an illustration showing an apparatus for depositing a planarizing layer over a wafer, in accordance with one embodiment of the present invention. The apparatus includes a tank 101 defined by an enclosing wall and a bottom. The tank 101 is configured to contain an electroless plating solution 103. The present invention can be implemented using suitable and commonly available electroless plating solutions, such as Cuposit250, manufactured by Shipley Company. Alternatively, a customized electroless plating solution can be developed for use with the present invention. It is preferable, however, that the electroless plating solution 103 be defined to react at moderate to higher temperatures. For example, in one embodiment, the electroless plating solution 103 will not react at temperatures below about 40° C.

In one embodiment, an inlet 113 is provided for supplying the electroless plating solution 103 to the tank 101, and an outlet 115 is provided for removing the electroless plating solution 103 from the tank 101. Thus, the inlet 113 and the outlet 115 can be used to control a flow of the electroless plating solution 103 through the tank 101. In one embodiment, the electroless plating solution 103 can be periodically replenished. In another embodiment, a continuous flow of the electroless plating solution 103 through the tank 101 can be provided. It should also be appreciated that baffles and other flow diverting mechanisms can be disposed within the tank 101 to provide a desired directionality and uniformity to the flow of electroless plating solution 103 through the tank 101. Furthermore, in one embodiment, a heat exchanger 117 can be implemented within the tank 101 to maintain a temperature of the electroless plating solution 103 within the tank 101. In another embodiment, the heat exchanger 117 can be implemented outside of the tank 101 to maintain the temperature of the electroless plating solution 103 entering the tank 101. In one embodiment, the heat exchanger 117 is represented as a coil over which the electroless plating solution 103 is flowed. However, it should be appreciated that any other type of heat exchanger 117 suitable for affecting the temperature of the electroless plating solution 103 can be implemented with the present invention. Preferably, the electroless plating solution 103 is maintained at a substantially low temperature. For example, in one embodiment, the electroless plating solution 103 is maintained at a temperature below about 15° C., wherein a lower bound of the electroless plating solution 103 temperature is limited by solubility.

The apparatus of FIG. 1 also includes a wafer support structure 105 disposed within the tank 101 to support a wafer 107 at a submerged position within the electroless plating solution 103. In one embodiment, the wafer support structure 105 is defined to provide substantially complete contact with a bottom surface of the wafer 107. However, in other embodiments, the wafer support structure 105 can be defined to provide partial contact with the bottom surface of the wafer 107. In one embodiment, the wafer support structure 105 can include a number of lifting pins configured to contact the bottom of the wafer 107. The number of lifting pins can be actuated to raise and lower the wafer 107 with respect to the wafer support structure 105, thus facilitating transport of the wafer 107 to and from the wafer support structure 105. Regardless of the specific wafer support structure 105 embodiment, the wafer support structure 105 is configured to securely hold the wafer 107 during a wafer planarization process. Additionally, the wafer support structure 105 is preferably configured to support the wafer 107 in an orientation that minimizes a potential for entrapment of gas bubbles that may evolve from electroless plating reactions.

The apparatus of FIG. 1 also includes a planar member 119 disposed above and substantially parallel to the wafer support structure 105. In one embodiment, the planar member is secured to vertically oriented support members 121. The support members 121 maintain the planar member 119 in the orientation substantially parallel to the wafer support structure 105. The support members 121 also provide a mechanism for moving the planar member 119 in directions toward and away from the wafer support structure 105, as indicated by arrows 123. Though vertically oriented support members 121 have been used to facilitate description of the present invention, it should be appreciated that many other support member configurations and orientations can be implemented to provide the necessary support and orientation control to the planar member 119. For example, in one embodiment, the planar member 119 can be secured to a horizontal support ring having linkage to a vertical translation device. Regardless of the specific embodiment, the support members 121 should be capable of moving the planar member 119 vertically and maintaining the planar member 119 in the orientation substantially parallel to the wafer support structure 105.

Prior to completing the wafer planarization process, a surface of the wafer 107 facing the planar member 119 will have a topography defined by a number of upper surface areas separated by lower surface areas. For discussion purposes, the upper surfaces areas are referred to as "peaks", and the lower surfaces areas are referred to as "trenches." The vertical movement of the planar member 119 is controlled in a precise manner to allow the planar member 119 to be positioned proximate to the wafer 107 to be supported by the wafer support structure 105. In one embodiment, positioning the planar member 119 proximate to the wafer 107 corresponds to positioning the planar member 119 at a distance within a range extending from about 0 micrometers to about 3 micrometers from a top surface of the wafer 107, wherein the top surface of the wafer 107 corresponds to a highest peak present on the surface of the wafer 107 facing the planar member 119. Values greater than 0 are encountered due to total thickness variation (waviness, warpage, nanotopography and film thickness variations, and topography of the features to be planarized).

During the planarization process, the planar member 119 is positioned proximate to the wafer 107. A surface of the planar member 119 facing the wafer 107 ("planarizing surface") will define the planarity achievable during the planarization process. Thus, the planarizing surface is carefully configured to represent the desired planarity to be applied to the wafer 107. In one embodiment, the planar member 119 is composed of a material that provides for local area rigidity and broad area flexibility. In other words, the planar member 119 of this embodiment is broadly flexible and locally rigid. Also, in conjunction with this embodiment, a backing member can be disposed against a backside of the planar member 119, wherein the backside is opposite the planarizing surface. The backing member is configured to control a planarity of the planarizing surface by applying a differential pressure distribution through the planar member 119 to the planarizing surface. In various embodiments, the backing member may implement fluid filled chambers or a distribution of materials having varying spring constants to achieve a desired differential pressure distribution. Furthermore, in another embodiment, the planarizing surface is rigid throughout. In various embodiments, the planar member 119 is formed from either quartz, sapphire, or polymer. It should be appreciated, however, that the planar member 119 can also be formed from a variety of other materials that offer acceptable planarity and rigidity properties. Additionally, the planar member 119 material should be capable of transmitting radiant energy 111 emitted from a radiant energy source 109 toward the wafer support structure 105.

As indicated above, the apparatus of FIG. 1 further includes the radiant energy source 109 disposed above both the planar member 119 and the wafer support structure 105. The radiant energy source 109 is oriented to direct radiant energy 111 through the planar member 119 and to the wafer 107 supported by the wafer support structure 105 at the submerged position within the electroless plating solution 103. The radiant energy source 109 is configured to generate radiant energy 111 having a wavelength range that is capable of selectively heating a material present at the surface of the wafer 107 facing the planar member 119 (i.e., a material upon which the radiant energy 111 will be incident). For purposes of discussion, the radiant energy 111 is characterized in terms of wavelength. However, it should be understood that the radiant energy 111 can be equivalently characterized in terms of frequency. For example, if the surface of the wafer 107 is defined by a material "X", the radiant energy 111 is defined to have a wavelength range that will be absorbed by the atoms/molecules of material "X" to increase excitation of the atoms/molecules of material "X". The increased excitation of the atoms/molecules of material "X" will result in a heating and increased temperature of the material "X". Preferably, the wavelength range of radiant energy 111 necessary to excite the material "X" atoms/molecules will cause zero or limited excitation of atoms/molecules in surrounding materials. Some immediately surrounding materials include different wafer 107 materials that are underlying or adjacent to material "X" and a bulk volume of the electroless plating solution 103. Thus, the radiant energy 111 generated by the radiant energy source 109 is configured to selectively heat a specific material present at the surface of the wafer 107. For example, to selectively heat Cu present on the surface of the wafer 107, the radiant energy may be defined to have a wavelength of about 250 nanometers.

In one embodiment, the electroless plating solution 103 is maintained at a sufficiently low temperature at which an electroless plating reaction will not occur. Thus, immersion of the wafer 107 into the electroless plating solution 103 is not sufficient to cause material deposition to occur on the wafer 107 surface through electroless plating reactions. However, selective heating of a particular material present on the wafer 107 surface through application of the radiant energy 111 will increase the temperature of the particular material to a point at which electroless plating reactions will occur. Since the particular material is selectively heated by the radiant energy 111, the electroless plating reactions will occur at the interface between the particular material and the electroless plating solution 103. With the planar member 119 positioned proximate to the wafer 107, the planarizing surface of the planar member 119 will serve as an upper confinement boundary for material deposited through electroless plating reactions on the wafer 107. Thus, the material deposited through electroless plating reactions on the wafer 107 will define the planarizing layer over the wafer 107, with the planarity of the planarizing layer being defined by the planarity of the planarizing surface.

It should also be appreciated that an increase in radiant energy 111 intensity will result in an increased temperature of the particular material excited by the radiant energy, with a corresponding increase in electroless plating reaction rate. Thus, with the apparatus of FIG. 1, a planarizing layer can be deposited over the wafer 107 through electroless plating reactions that are initiated and controlled by varying the temperature of the particular material on the wafer 107 surface using appropriately defined and controlled radiant energy 111.

Preferably, the radiant energy source 109 is configured to apply a substantially uniform amount of radiant energy 111 over the surface of the wafer 107. In one embodiment, the radiant energy source 109 is configured to maintain a stationary position during the planarization process. However, the stationary radiant energy source 109 is capable of uniformly applying radiant energy 111 over the top surface of the wafer 107. It should be appreciated that a variety of radiant energy 111 reflecting surfaces can be used in conjunction with the stationary radiant energy source 109 to achieve uniform application of the radiant energy 111 over the surface of the wafer 107. Also, in an alternative embodiment, an array of radiant energy sources can be implemented to uniformly apply the radiant energy 111 over the top surface of the wafer 107. Furthermore, various types of monitoring equipment commonly used in the wafer fabrication process to collect data associated with a surface condition of the wafer can be implemented with the apparatus of FIG. 1. Data obtained from the monitoring equipment can be used as feedback to control the radiant energy source 109.

Figure 2A:
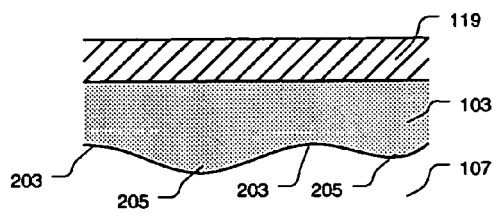
FIG. 2A represents an illustration showing a planarization process performed by depositing a planarizing layer over a wafer, in accordance with one embodiment of the present invention.

FIGS. 2A through 2I represent a sequence of illustrations showing a planarization process performed by depositing a planarizing layer over a wafer, in accordance with one embodiment of the present invention. Each of FIGS. 2A through 2I represent a cross-section view of a portion of the wafer 107 and a corresponding portion of the planar member 119 during various stages of the planarization process. With respect to FIG. 2A, the planarization process begins by positioning the planar member 119 away from the wafer 107 to allow the electroless plating solution 103 to be interspersed between the planar member 119 and the wafer 107. The electroless plating solution 103 is maintained at a sufficiently low temperature at which electroless plating reactions will not readily occur. In one embodiment, as previously discussed with respect to FIG. 1, the wafer 107 is disposed on a wafer support structure at a submerged position within a bath of electroless plating solution 103. Also, as shown in FIG. 2A, prior to performing the planarization process, the wafer 107 has a surface topography defined by a number of peaks 203 and trenches 205.

Figure 2E:
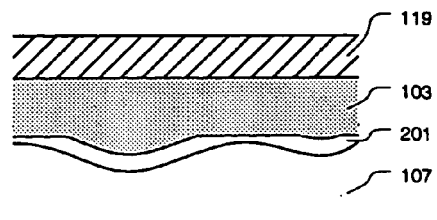
FIG. 2E represents an illustration showing a planarization process performed by depositing a planarizing layer over a wafer, in accordance with one embodiment of the present invention.
Figure 2B:
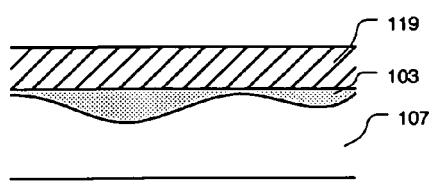
FIG. 2B represents an illustration showing a planarization process performed by depositing a planarizing layer over a wafer, in accordance with one embodiment of the present invention.

With respect to FIG. 2B, the planar member 119 is positioned proximate to the top surface of the wafer 107, wherein the top surface of the wafer 107 is defined by the highest peak present on the surface of the wafer 107. The planar member 119 is also oriented to be substantially parallel to the wafer support structure upon which the wafer is disposed. As the planar member 119 is moved toward the wafer 107, electroless plating solution interposed between the planar member 119 and the wafer 107 is expelled, leaving electroless plating solution within the trenches of the wafer 107 surface. Also, since the planar member 119 is proximate to the top surface of the wafer 107, a minute amount of electroless plating solution may be present between the planar member 119 and the top surface of the wafer 107. In one embodiment, the planar member 119 is positioned as close to the top surface of the wafer 107 as possible without causing damage to the wafer 107.

Figure 2F:
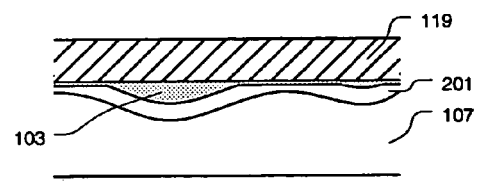
FIG. 2F represents an illustration showing a planarization process performed by depositing a planarizing layer over a wafer, in accordance with one embodiment of the present invention.
Figure 2C:
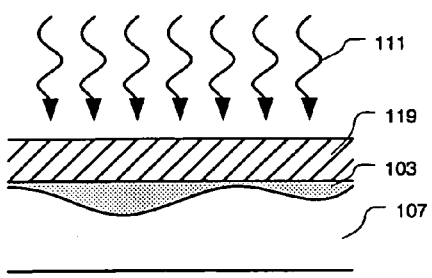
FIG. 2C represents an illustration showing a planarization process performed by depositing a planarizing layer over a wafer, in accordance with one embodiment of the present invention.

In FIG. 2C, the radiant energy 111 is transmitted through the planar member 119 to the wafer 107. The radiant energy 111 is defined to have a wavelength range that will selectively heat a material present at the surface of the wafer 107 causing the temperature of the material to increase to a state at which electroless plating reactions occur. In one embodiment, the radiant energy 111 continues to be applied until essentially all of the available reactants in the electroless plating solution present between the planar member 119 and the wafer 107 are consumed. In one embodiment, a time required to consume the available reactants is within a range extending from about 0.01 second to about 10 seconds. Also, the planarizing surface of the planar member 119 serves as an upper confinement boundary for material deposited through electroless plating reactions.

Figure 2G:
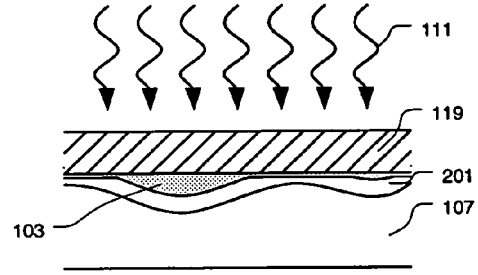
FIG. 2G represents an illustration showing a planarization process performed by depositing a planarizing layer over a wafer, in accordance with one embodiment of the present invention.
Figure 2D:
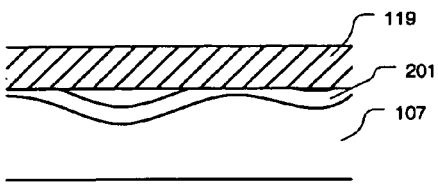
FIG. 2D represents an illustration showing a planarization process performed by depositing a planarizing layer over a wafer, in accordance with one embodiment of the present invention.

FIG. 2D represents a stage of the planarization process following consumption of essentially all of the available reactants in the electroless plating solution present between the planar member 119 and the wafer 107. Correspondingly, application of the radiant energy 111 is discontinued. At this stage, a portion of the planarizing layer 201 has been deposited over the wafer 107. However, due to limitations on reactant concentrations within the electroless plating solution, a single application of radiant energy 111 may not sufficient to fully planarize the wafer 107.

In FIG. 2E, the planar member 119 is moved away from the wafer 107 to allow fresh electroless plating solution 103 to be interspersed between the planar member 119 and the wafer 107. In following, FIG. 2F represents another iteration of the planarization process in which the planar member 119 is again positioned proximate to the top surface of the wafer 107. With respect to FIG. 2F, the top surface of the wafer 107 is now defined by the portion of planarizing layer formed during the previous application of radiant energy 111. The sequence of moving the planar member 119 away from the wafer 107 followed by repositioning the planar member 119 proximate to the wafer is referred to as refreshing. In one embodiment, the refreshing is performed quickly to minimize an amount of material deposition that occurs during the refreshing.

In FIG. 2G, the radiant energy 111 is again transmitted through the planar member 119 to the wafer 107. The radiant energy 111 heats the material present at the surface of the wafer 107 to a temperature at which electroless plating reactions occur. The radiant energy 111 is applied to allow essentially all of the available reactants in the electroless plating solution present between the planar member 119 and the wafer 107 to be consumed.

Figure 2H:
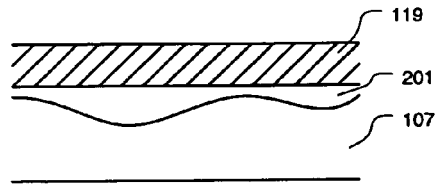
FIG. 2H represents an illustration showing a planarization process performed by depositing a planarizing layer over a wafer, in accordance with one embodiment of the present invention.
Figure 2I:
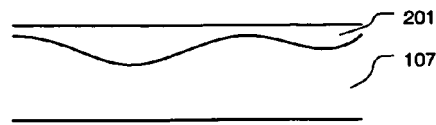
FIG. 2I represents an illustration showing a planarization process performed by depositing a planarizing layer over a wafer, in accordance with one embodiment of the present invention.

FIG. 2H represents completion of a final iteration of the planarization process. As shown in FIG. 2I, the material deposited through electroless plating reactions has filled the trenches present on the wafer 107 surface and has formed a planarizing layer of material over the wafer 107. Since, the planarizing surface of the planar member 119 serves as an upper confinement boundary for material deposited through electroless plating reactions, the planarity of the planarizing layer deposited over the wafer is defined by the planarizing surface. Furthermore, formation of the planarizing layer over the wafer 107 is self-limiting due to minimization of electroless plating solution between the planar member 119 and the wafer 107 as the planarizing surface and the wafer 107 surface approach co-planarity.

Figure 3:
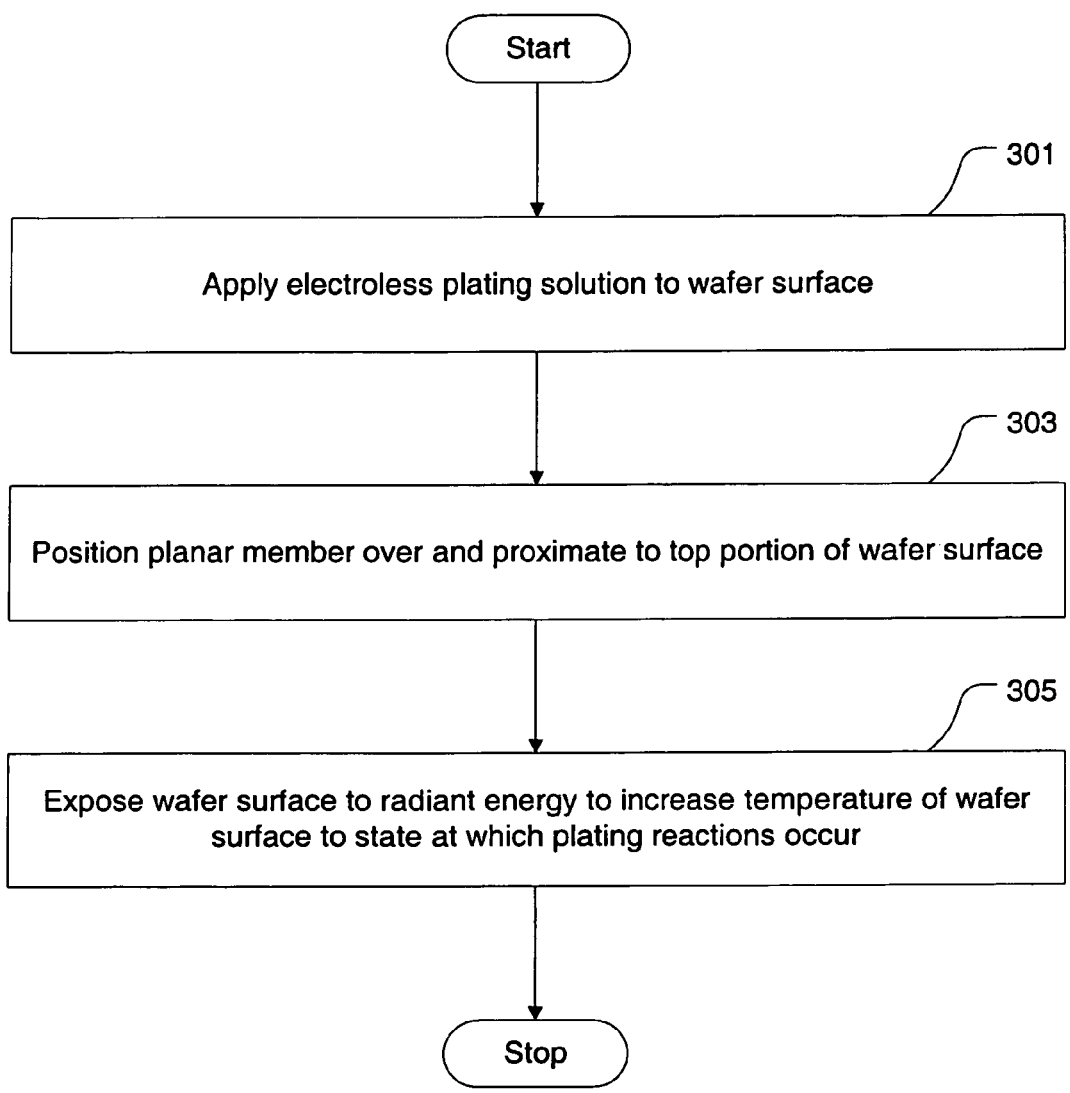
FIG. 3 is an illustration showing a flowchart of a method for applying a planarizing layer on a surface of a wafer, in accordance with one embodiment of the present invention.

FIG. 3 is an illustration showing a flowchart of a method for applying a planarizing layer on a surface of a wafer, in accordance with one embodiment of the present invention. The method includes an operation 310 in which an electroless plating solution is applied to a wafer surface. The electroless plating solution is maintained at a temperature at which a plating reaction does not readily occur. In one embodiment, the electroless plating solution is applied to the wafer surface by submerging the wafer in a bath of electroless plating solution. The method also includes an operation 303 in which a planar member is positioned over and proximate to a top portion of the wafer surface. In one embodiment, the planar member is positioned within a range extending from about 0 micrometers to about 3 micrometers from the top portion of the wafer surface. Positioning the planar member proximate to the wafer surface serves to expel a portion of electroless plating solution interposed between the planar member and the wafer surface. Additionally, positioning the planar member proximate to the wafer surface also serves to entrap a portion of the electroless plating solution within recessed areas of the wafer surface.

The method further includes an operation 305 in which the wafer surface is exposed to radiant energy to increase a temperature of the wafer surface to a state at which plating reactions occur. To reach the wafer surface, the radiant energy passes through the planar member positioned over and proximate to the wafer surface. Due to the increase in temperature at the wafer surface, plating reactions occur at an interface between the electroless plating solution and the wafer surface. The plating reactions result in formation of a planarizing layer between the wafer surface and the planar member. In one embodiment, exposure of the wafer surface to the radiant energy continues until reactants contained within the electroless plating solution adjacent to the wafer surface are consumed. Also, in one embodiment, the wafer surface is exposed to the radiant energy in a substantially uniform manner. Furthermore, a wavelength range of the radiant energy can be controlled to selectively heat a particular material present at the wafer surface. Conditions at the wafer surface can be monitored to ensure that the wavelength range of the radiant energy is established to selectively heat the particular material present at the wafer surface.

In some instances, full consumption of reactants contained within the electroless plating solution adjacent to the wafer surface is not sufficient to completely planarize the wafer surface. In these instances, operations 301 through 305 can be iteratively performed until a desired planarization of the wafer surface is achieved. For example, in one embodiment, exposure of the wafer surface to the radiant energy in operation 305 is ceased when a reactant concentration within the electroless solution adjacent to the wafer surface reaches a specified low level. Then, the planar member is removed from the position proximate to the top portion of the wafer surface. Removal of the planar member allows fresh electroless plating solution to flow over the wafer surface. The fresh electroless plating solution serves to quench the wafer surface and replenish reactants present in a vicinity of the wafer surface. Then, the operations 301 through 305 are repeated.

Figure 4:
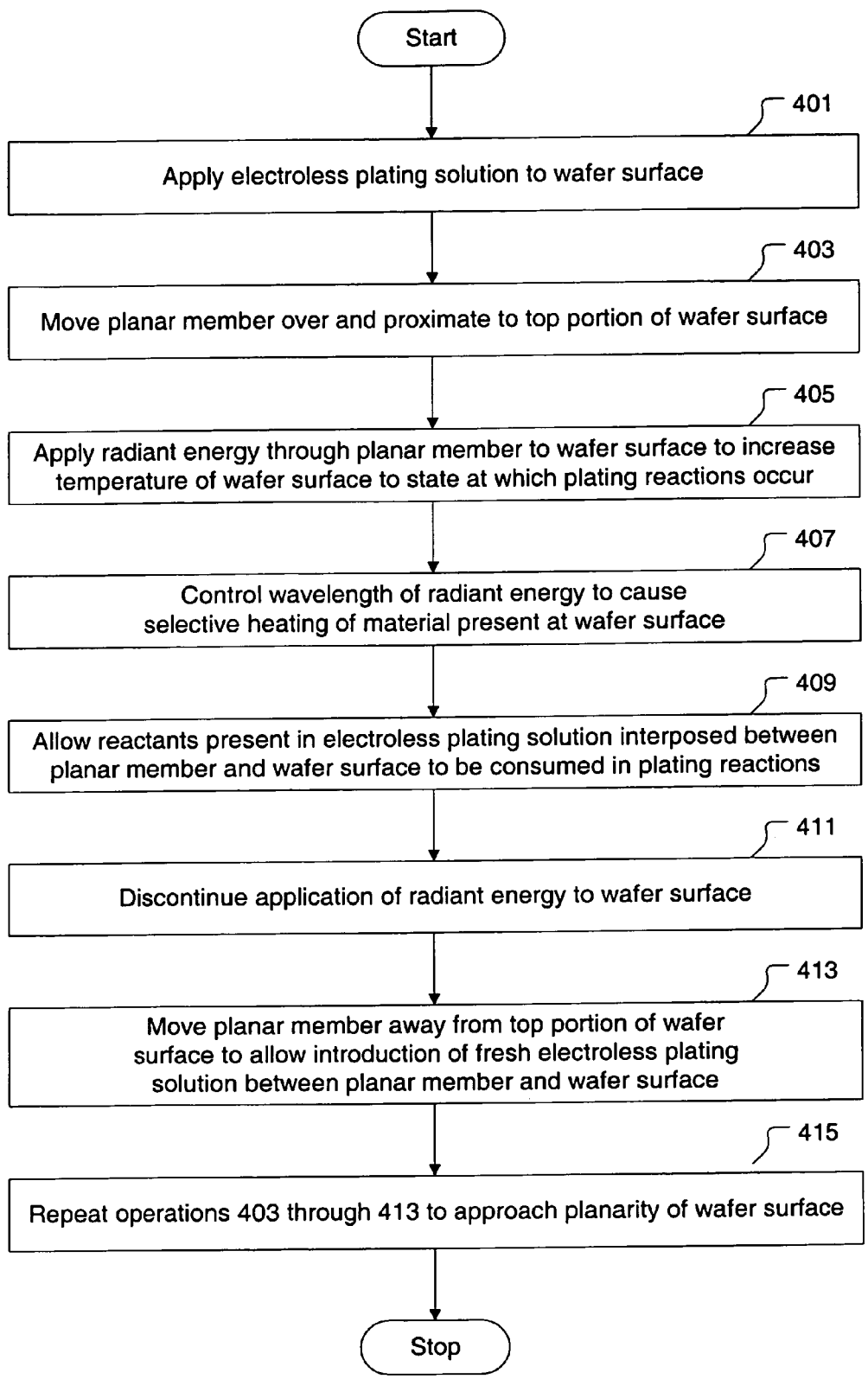
FIG. 4 is an illustration showing a flowchart of another method for applying a planarizing layer on a surface of a wafer, in accordance with one embodiment of the present invention.

FIG. 4 is an illustration showing a flowchart of another method for applying a planarizing layer on a surface of a wafer, in accordance with one embodiment of the present invention. The method includes an operation 401 for applying an electroless plating solution to a wafer surface. The electroless plating solution is maintained at a temperature at which a plating reaction does not readily occur. In one embodiment, applying the electroless plating solution to the wafer surface is performed by submerging the wafer in a bath of the electroless plating solution. The method also includes an operation 403 for moving a planar member over and proximate to a top portion of the wafer surface. Movement of the planar member serves to expel a portion of electroless plating solution interposed between the planar member and the wafer surface. Additionally, movement of the planar member serves to entrap a portion of the electroless plating solution within recessed areas of the wafer surface. An operation 405 is also provided for applying radiant energy through the planar member and to the wafer surface. The radiant energy is capable of increasing a temperature of the wafer surface to a state at which plating reactions will occur at an interface between the electroless plating solution and the wafer surface. In an operation 407, a wavelength range of the radiant energy is controlled to cause the radiant energy to selectively heat a material present at the wafer surface. Furthermore, in an operation 409, reactants present in a remaining amount of electroless plating solution interposed between the planar member and the wafer surface are allowed to be consumed in plating reactions. The method also includes an operation 411 for discontinuing application of the radiant energy to the wafer surface. Following the operation 411, an operation 413 is performed to move the planar member away from the top portion of the wafer surface. Movement of the planar member away from the top portion of the wafer surface allows fresh electroless plating solution to be introduced between the planar member and the wafer surface. The method further includes an operation 415 in which operations 403 through 413 are repeated in a cyclic manner such that the wafer surface approaches a planar condition. In one embodiment, a reactant concentration present in the fresh electroless plating solution is increased during each cycle to compensate for a reduced volume to be occupied by the electroless plating solution between the wafer surface and the planar member positioned proximate to the wafer surface.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. An apparatus for depositing a planarizing layer over a wafer, comprising:
   a tank defined by a bottom and an enclosing wall, the tank being configured to contain an electroless plating solution;
   a wafer support structure disposed within the tank, the wafer support structure being configured to support a wafer at a submerged position within the electroless plating solution to be contained within the tank;
   a planar member disposed above and substantially parallel to the wafer support structure, the planar member capable of being positioned proximate to the wafer to be supported by the wafer support structure such that the planar member serves as an upper confinement boundary for material deposited on the wafer through electroless plating reactions; and
   a radiant energy source disposed above the planar member and above the wafer support structure, the radiant energy source being oriented to direct radiant energy through the planar member and to the wafer to be supported by the wafer support structure.

2. An apparatus for depositing a planarizing layer over a wafer as recited in claim 1, the planar member being composed of a material capable of transmitting radiant energy emitted from the radiant energy source toward the wafer support structure.

3. An apparatus for depositing a planarizing layer over a wafer as recited in claim 2, wherein the planar member is formed from one of quartz, sapphire, and polymer.

4. An apparatus for depositing a planarizing layer over a wafer as recited in claim 1, wherein the radiant energy source is configured to generate radiant energy having a wavelength range that is capable of selectively heating a material present at a surface of the wafer upon which the radiant energy will be incident.

5. An apparatus for depositing a planarizing layer over a wafer as recited in claim 1, wherein the radiant energy source is configured to apply a substantially uniform amount of the radiant energy over a surface of the wafer upon which the radiant energy will be incident.

6. An apparatus for depositing a planarizing layer over a wafer as recited in claim 1, wherein the planar member is broadly flexible and locally rigid.

7. An apparatus for depositing a planarizing layer over a wafer as recited in claim 1, further comprising:
   a backing member disposed against a backside of the planar member, the backside of the planar member facing away from the wafer support structure, the backing member being configured to control a planarity of the planar member.

8. An apparatus for depositing a planarizing layer over a wafer as recited in claim 1, further comprising:
   an inlet for supplying the electroless plating solution to the tank; and
   an outlet for removing the electroless plating solution from the tank.

9. An apparatus for depositing a planarizing layer over a wafer as recited in claim 1, further comprising:
   a heat exchanger capable of maintaining a temperature of the electroless plating solution to be contained within the tank.

10. An apparatus for depositing a planarizing layer over a wafer as recited in claim 1, wherein the planar member is capable of being positioned within three micrometers of a top surface of the wafer to be supported by the wafer support structure.

11. An apparatus for depositing a planarizing layer over a wafer, comprising:
    a tank defined by a bottom and an enclosing wall, the tank being configured to contain an electroless plating solution;
    a wafer support structure disposed within the tank, the wafer support structure being configured to support a wafer at a submerged position within the electroless plating solution to be contained within the tank;
    a planar member disposed above and substantially parallel to the wafer support structure, the planar member capable of being positioned proximate to the wafer to be supported by the wafer support structure such that the planar member serves as an upper confinement boundary for material deposited on the wafer through electroless plating reactions; and
    a radiant energy source disposed above the planar member and above the wafer support structure, the radiant energy source being oriented to direct radiant energy through the planar member such that a substantially uniform amount of radiant energy is applied to a top surface of the wafer to be supported by the wafer support structure.

12. An apparatus for depositing a planarizing layer over a wafer as recited in claim 11, further comprising:
    radiant energy reflecting surfaces disposed within the tank to facilitate uniform application of the radiant energy to the top surface of the wafer.

13. An apparatus for depositing a planarizing layer over a wafer, comprising:
    a tank defined by a bottom and an enclosing wall, the tank being configured to contain an electroless plating solution;
    a wafer support structure disposed within the tank, the wafer support structure being configured to support a wafer at a submerged position within the electroless plating solution to be contained within the tank;
    a planar member disposed above and proximate to the wafer to be supported by the wafer support structure such that the planar member serves as an upper confinement boundary for material deposited on the wafer through electroless plating reactions;

a backing member disposed against a backside of the planar member, the backside of the planar member facing away from the wafer support structure, the backing member being configured to control a planarity of the planar member; and a radiant energy source disposed to direct radiant energy through the planar member and to the wafer to be supported by the wafer support structure.

14. An apparatus for depositing a planarizing layer over a wafer as recited in claim 13, wherein the backing member is defined to apply a differential pressure distribution through the planar member to a planarizing surface of the planar member, the planarizing surface of the planar member facing toward the wafer support structure.

15. An apparatus for depositing a planarizing layer over a wafer as recited in claim 14, wherein the backing member includes a distribution of materials having varying spring constants for applying the differential pressure distribution through the planar member.

16. An apparatus for depositing a planarizing layer over a wafer as recited in claim 14, wherein the backing member includes a number of fluid filled chambers for applying the differential pressure distribution through the planar member.

* * * * *